United States Patent
Orban et al.

(10) Patent No.: US 11,079,435 B2
(45) Date of Patent: Aug. 3, 2021

(54) METHOD AND DEVICE FOR DIAGNOSING WEAR OF AN ELECTRICAL SWITCHING UNIT, AND ELECTRICAL UNIT COMPRISING SUCH A DEVICE

(71) Applicant: Schneider Electric Industries SAS, Rueil-Malmaison (FR)

(72) Inventors: Remy Orban, Saint Martin D'uriage (FR); Jose Desforges, Seyssins (FR)

(73) Assignee: Schneider Electric Industries SAS, Rueil-Malmaison (FR)

( * ) Notice: Subject to any disclaimer, the term of this patent is extended or adjusted under 35 U.S.C. 154(b) by 87 days.

(21) Appl. No.: 16/380,225

(22) Filed: Apr. 10, 2019

(65) Prior Publication Data

US 2019/0371551 A1    Dec. 5, 2019

(30) Foreign Application Priority Data

Jun. 1, 2018    (FR) ..................... 18 54786

(51) Int. Cl.
*G01R 31/327*    (2006.01)
*H01H 47/00*    (2006.01)
(Continued)

(52) U.S. Cl.
CPC ..... *G01R 31/3274* (2013.01); *G01R 31/3278* (2013.01); *G01R 31/50* (2020.01);
(Continued)

(58) Field of Classification Search
CPC ...... H01H 47/002; H01H 50/44; H01H 50/54; G01R 31/3278
See application file for complete search history.

(56) References Cited

U.S. PATENT DOCUMENTS

| 5,604,437 A | 2/1997 | Moncorge et al. |
| 6,487,505 B1 | 11/2002 | Mock et al. |

(Continued)

FOREIGN PATENT DOCUMENTS

| DE | 393641 | 4/1924 |
| DE | 198 04 196 A1 | 8/1999 |

(Continued)

OTHER PUBLICATIONS

French Preliminary Search Report dated Mar. 4, 2019 in French Application 18 54786, filed on Jun. 1, 2018 (with English translation of categories of Cited Documents and Written Opinion).

(Continued)

*Primary Examiner* — Clayton E. LaBalle
*Assistant Examiner* — Michael A Harrison
(74) *Attorney, Agent, or Firm* — Oblon, McClelland, Maier & Neustadt, L.L.P.

(57) ABSTRACT

A method for diagnosing the wear status of an electrical switching unit including a phase for monitoring the electrical unit. The monitoring phase uses: learning data previously loaded and representative of the type of electrical unit, and initialization data corresponding to the unit to be monitored and stored in memory during an initialization phase. The monitoring phase includes the measurement and the acquisition of a measurement curve upon the opening of the electrical unit, the determination of values of local descriptors with little sensitivity to the temperature from the measurement curve as a function of values of the measurement curve, of initialization data, and of learning data, the determination of a global status class as a function of the positioning values. The device and the electrical unit implement the method.

13 Claims, 7 Drawing Sheets

(51) Int. Cl.
 H01H 50/44    (2006.01)
 H01H 50/54    (2006.01)
 G01R 31/50    (2020.01)
(52) U.S. Cl.
 CPC .......... *H01H 47/002* (2013.01); *H01H 50/44* (2013.01); *H01H 50/54* (2013.01)

(56) References Cited

U.S. PATENT DOCUMENTS

| | | |
|---|---|---|
| 2004/0223276 A1 | 11/2004 | Wimmer |
| 2007/0222427 A1 | 9/2007 | Takeuchi et al. |
| 2013/0103334 A1* | 4/2013 | Delbaere ............. H01H 1/0015 702/64 |

FOREIGN PATENT DOCUMENTS

| | | |
|---|---|---|
| DE | 10 2011 016 895 A1 | 10/2012 |
| EP | 0 665 567 A1 | 8/1995 |
| EP | 1 475 813 A1 | 11/2004 |
| EP | 1 555 683 A1 | 7/2005 |
| EP | 2 584 575 A1 | 4/2013 |
| WO | WO 2013/189527 A1 | 12/2013 |

OTHER PUBLICATIONS

John J. Shea, "High Current AC Break Arc Contact Erosion", Proceedings of the 54$^{th}$ IEEE Holm Conference on Electrical Contacts, IEEE, Piscataway, NY, USA, XP031368143, Oct. 27, 2008, 23 pages.

* cited by examiner

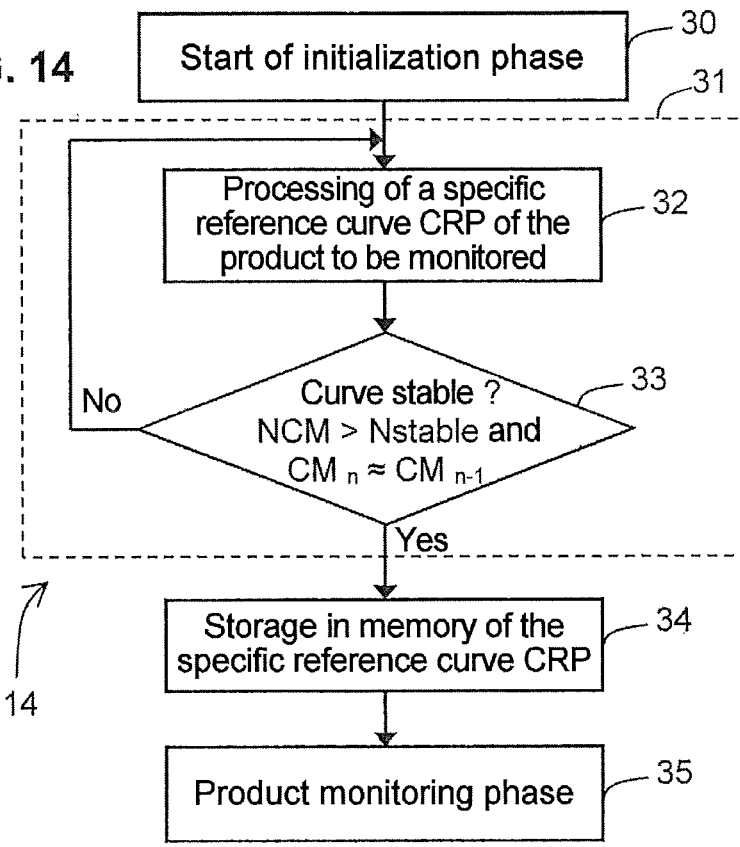
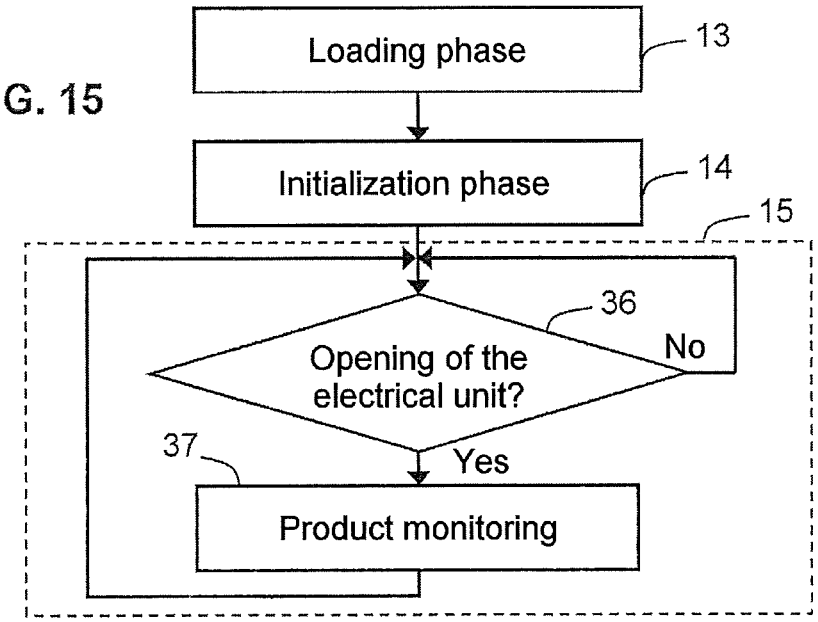

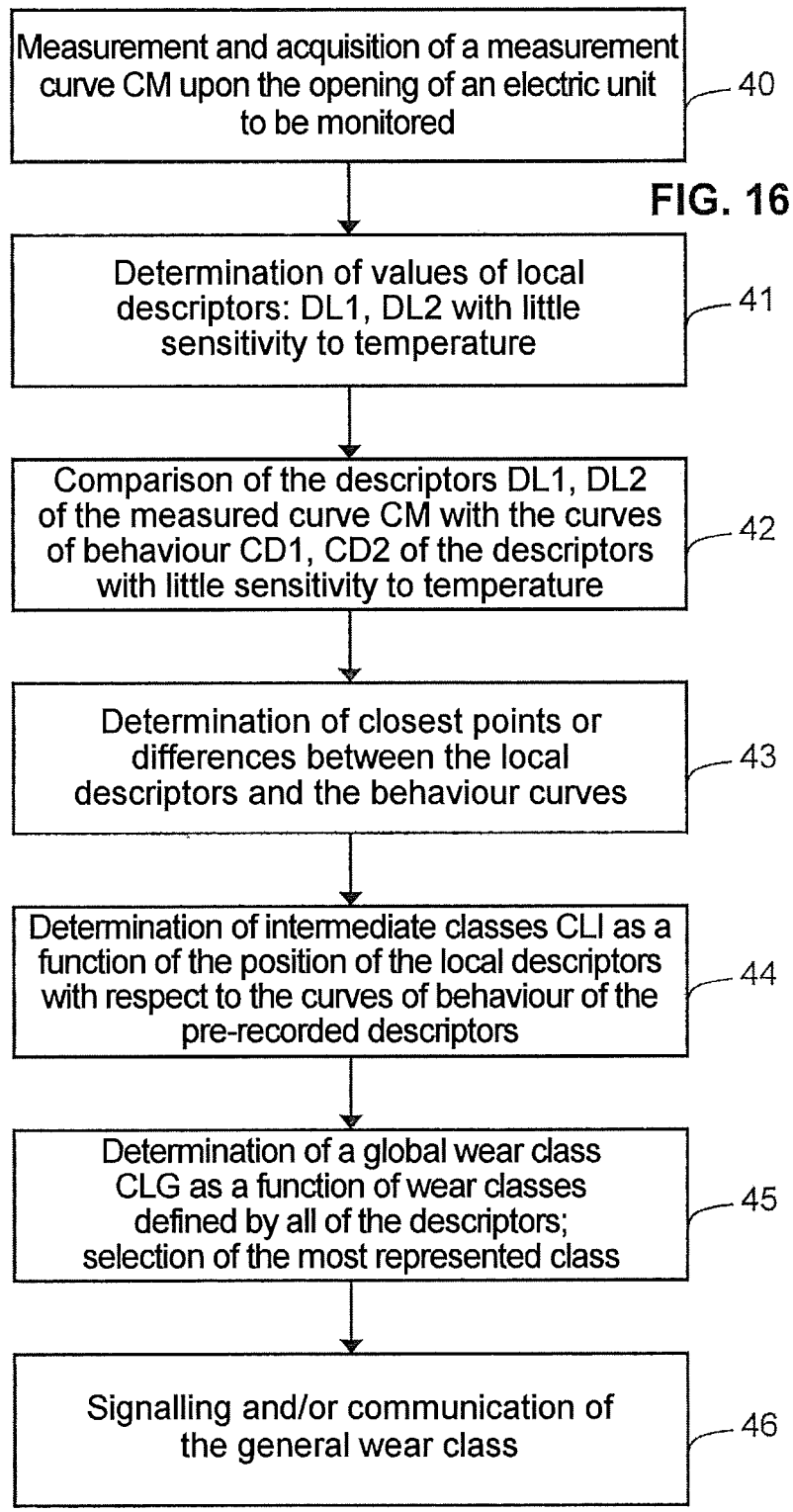

METHOD AND DEVICE FOR DIAGNOSING WEAR OF AN ELECTRICAL SWITCHING UNIT, AND ELECTRICAL UNIT COMPRISING SUCH A DEVICE

TECHNICAL FIELD

The invention relates to a method for diagnosing the wear status of an electrical switching unit comprising a phase for monitoring the electrical unit.

The invention also relates to a diagnostic device and a unit implementing the method.

PRIOR ART

The methods and devices for diagnosing the status of electrical units generally monitor one or more electrical characteristics by comparing them with a range of values. Amongst these characteristics are generally a voltage, a current or a time reference of a noteworthy point of an electrical signal. A diagnostic method of this type is disclosed in the Patent application EP2584575.

Other methods determine the wear of contacts of electrical units such as contactors by evaluating a time between two events or the duration of one event. For example, a time between the command for the opening or closing of contacts and the effective moment of said opening or closing. Patent application WO03054895 describes a particular way of detecting the wear of contacts of an electrical unit as a function of the moment of the appearance of a primary current after a control command.

The known diagnostic methods and devices offer satisfactory results but are not easy to deploy on existing or already installed units. Generally speaking, an intervention into the electrical units is required. Moreover, there is a need to have higher precision and levels of certainty for the monitoring of certain electrical units such as contactors.

Another drawback of the known devices is their sensitivity to the variations in temperature. Such devices also require temperature measurements in order to compensate the evaluation of the wear of electrical contacts.

DESCRIPTION OF THE INVENTION

The aim of the invention is a method and a device for diagnosing an electrical unit supplying a result having an improved certainty, being easy to implement on electrical units and having little sensitivity to the variations in temperature.

In a method for diagnosing the wear status of an electrical switching unit according to the invention comprising a phase for monitoring said electrical unit,
  said monitoring phase uses:
  learning data previously loaded and corresponding to a type of product representative of said electrical unit, and
  initialization data corresponding to said unit to be monitored and stored during an initialization phase,
and
  said monitoring phase comprises:
  the measurement and the acquisition of a measurement curve upon the opening of said electrical unit,
  the determination of values of local descriptors from said measurement curve as a function of values of said measurement curve, of recorded initialization data, and of first loaded learning data, at least one of said local descriptors being a descriptor with little sensitivity to the differences in temperature and dependent on noteworthy points of said measurement curve,
  the determination of the positioning of the values of local descriptors with little sensitivity to temperature of the measurement curve with respect to second learning data, and
  the determination of a global status class as a function of said values of positioning of the values of local descriptors and of the measurement curve with respect to said second learning data.

According to one preferred embodiment of the invention, a first descriptor corresponds to a curve surface or to an integral or integration starting at a first point of the curve, the measurement depending on a first noteworthy point of said curve, the measurement corresponding to a first change in direction of the variation of the signal or of change in sign of the derivative of said measurement signal, said first noteworthy point being representative of the start of the movement of a mobile part of the electrical unit.

Preferably, the integral of the signal starts at a time t1 in the range between 0 and 10 ms prior to the occurrence of said first noteworthy point.

Advantageously, the integral of the signal ends when the signal of the coil voltage curve is zero or close to zero volts. For example, less than 2 Volts in absolute value. Preferably, the integral of the signal lasts between 30 ms and 40 ms.

According to a preferred embodiment of the invention, a second descriptor corresponds to a positioning or to a difference of a second noteworthy point with respect to an initial reference curve or line for said second noteworthy point of a new unit defined over a range of temperatures, said second noteworthy point corresponding to a variation in value such as the change in sign of the variation of a signal on the measurement curve, said signal decreasing then increasing in relative value around the second noteworthy point.

Advantageously, at least one descriptor with little sensitivity to the temperature has a difference in value of less than 5% between −20° C. and 80° C.

Preferably, loaded learning data are representative of descriptor behaviour curves representative of predefined characteristics of said electrical signal during the lifetime of said electrical units.

Preferably, said descriptor behaviour curves are loaded in a straight-line segment definition format in order to reduce the memory space required by said learning data.

Advantageously, values of said pre-loaded descriptor behaviour curves are associated with status or wear classes of units to be monitored.

According to a preferred embodiment, the method comprises:
  a prior learning phase for determining, during a number of predetermined manoeuvres, learning data representative of at least two descriptor behaviour curves representative of predefined characteristics of said electrical signal during the lifetime of said electrical unit,
  storing said learning data in memory,
  the loading of said learning data, and
  the use of the learning data in said phase for monitoring said electrical unit.

A device according to the invention for diagnosing the wear status of an electrical switching unit connected to an electromagnetic coil for actuating contacts of said switching unit comprises a processing circuit for implementing the diagnostic method such as defined hereinabove.

Preferably, the processing circuit comprises a local module for processing the diagnosis close to said unit connected to an external processing module remote from said unit.

An electrical unit according to the invention comprising high-power electrical contacts actuated by a control electromagnetic coil comprises a device for diagnosing the wear status of the electrical switching unit connected to said electromagnetic coil for actuating said contacts and implementing the diagnostic method such as defined hereinabove.

BRIEF DESCRIPTION OF THE DRAWINGS

Other advantages and features will become more clearly apparent from the description that follows of particular embodiments of the invention, given by way of non-limiting examples, and shown in the appended drawings in which:

FIG. 14 shows steps of the initialization phase of a method according to one embodiment of the invention;

FIG. 15 shows a monitoring phase of a method according to one embodiment of the invention; and FIG. 16 shows steps of a monitoring phase of a method according to one embodiment of the invention.

DETAILED DESCRIPTION OF EMBODIMENTS

Figure 1:
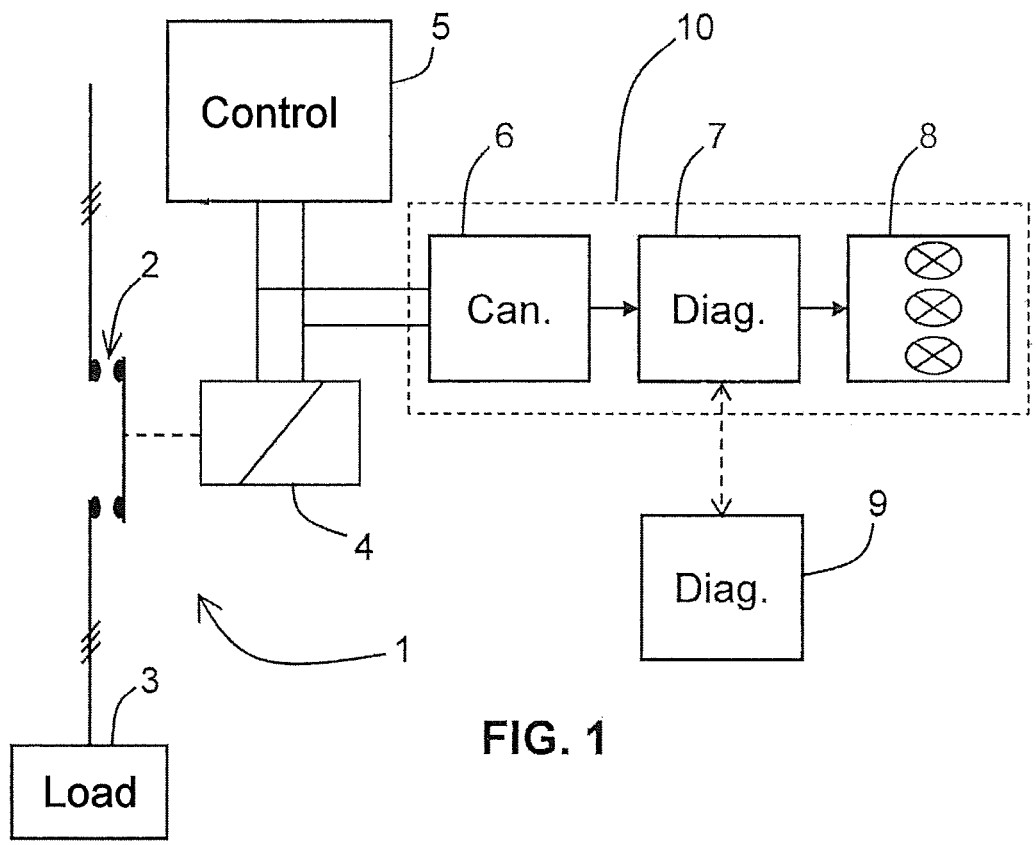
FIG. 1 shows an overall diagram of an electrical unit comprising a monitoring device according to one embodiment of the invention.

In FIG. 1, an electrical unit 1 of the contactor type comprises one or more high-power electrical contacts 2 for supplying power or interrupting the electrical supply to a load 3. The electrical contacts are controlled by an electromagnetic coil 4. A control circuit 5 controls the electromagnetic coil 4 for closing or opening the contacts 2. The circuit 5 also controls a current flowing in the coil during a surge phase at the time of the closing of the contacts and during a phase for maintaining the contacts closed with a reduced energy and control current.

A device 10 for diagnosing the wear of the unit 1 is associated with or forms a part of the electrical unit. This device 10 receives a signal representative of an electrical quantity such as the voltage or the current on the coil 4 for controlling the contacts. Advantageously, the device 10 is connected in parallel with the coil in order to receive a voltage signal generated by the coil when the contacts are opened. A signal from current flowing in the coil may also be used. However, in a preferred embodiment, a voltage signal is advantageously more stable and easy to use. Thus, the device 10 comprises an Analogue-Digital converter 6 connected to the coil 4, a diagnostic module 7 connected to the converter for receiving the signal and processing the diagnosis of the electrical unit, and a device 8 for signalling the status of the electrical unit, notably its level of wear of the contacts. The diagnostic module 7 may also be connected and process data with another external or separate processing module 9. In this case, the diagnostic device is in two or more parts. It is also possible for external parts to be common to several devices or centralized. The processing module 9 may provide the remote signalling of the status of the unit. It goes without saying that the communications between the modules and the devices may take the form of wired or wireless communications.

Thus, the monitoring and the diagnosis of the wear of the electrical unit such as a contactor is carried out preferably by the analysis of the voltage on the coil upon the opening of said contactor. This voltage is representative of the speed of the movement of the mobile part of the contactor. In this case, the wear of the contacts leads to a decrease in the speed of movement of the mobile part of the electrical unit.

Figure 2:
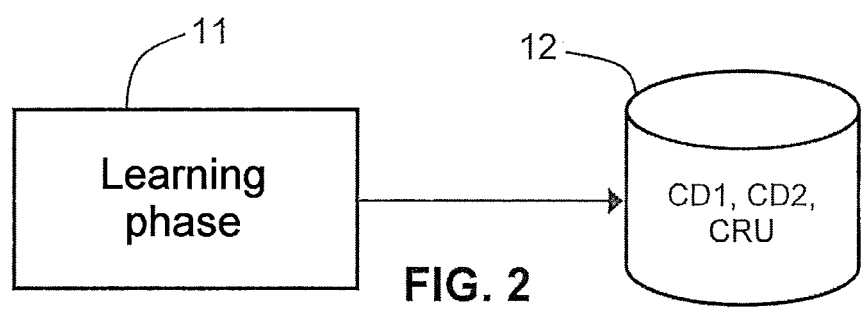
FIG. 2 shows a learning phase of a method according to one embodiment of the invention.

The diagnosis of the wear status of the electrical unit comprises a prior learning phase carried out on a large number of products during lifetime cycles of said units. Advantageously, the learning may also be carried out by numerical simulation in order to determine a relationship between the behaviours of the descriptors over time, notably D1, D2, and a quantity characteristic of the status of the unit such as the wear of the contacts. This learning phase allows learning data to be acquired which will firstly be stored in memory, modelled and stored then loaded into each unit to be monitored for monitoring its own wear. FIG. 2 illustrates a learning phase 11 and the storage 12 of the learning data.

During the learning phase, measurement curves are acquired during the opening of the units in a wear cycle. Measurement curves represent an electrical signal which lasts a few tens of milliseconds, for example 30 ms to 50 ms for an electrical unit of average size. These durations may be very different depending on the size and the type of the units. The signal is generally sampled with a few hundreds of samples, for example between 80 and 500 samples but a different number may also be used; it will depend on the calculation capacity of a processor used in the diagnostic device.

During the learning phase, the electrical units undergo the quantities of manoeuvres allowing the life of a unit to be followed. For a contactor, the number of manoeuvres may for example reach 800000, although other values may also be used. Since the amount of data may be considerable, the behaviour over time of the characteristics of the electrical unit is defined by descriptors D1, D2 with little sensitivity to the variations in temperature associated with electrical characteristics and with curves of behaviour CD1, CD2 of said descriptors during the lifetime of an electrical unit. In order to further reduce the size of the learning data which will subsequently be loaded into the devices of the units to be diagnosed, the curves of behaviour CD1, CD2 of the descriptors are recorded in the form of data representative of segments of straight lines of the a +bx type. A curve of behaviour over time may have several successive segments of straight lines defining the lifetime of a unit. The set of curves of behaviour over time of the descriptors CD1, CD2 forms, over the lifetime of a product, a space of several dimensions. Parts, portions of curves or values of descriptors are associated with status or wear classes of the electrical unit. In view of the number of manoeuvres of the units, the measurement curves are not necessarily acquired upon each opening. The acquisition of the measurement curves may be regularly spaced out by intervals of number of manoeuvres or in a more relevant manner according to the variation over time of the units. For example, the number of manoeuvres may be more frequent towards the end of life and very spaced out at the start of life.

The learning phase may also supply a worn reference curve CRU. This worn reference curve is taken from the measurement curves at the end of life of the units used for the learning. The worn reference curve CRU may be a curve averaged over several measurement curves and/or over several worn units.

Figure 3:
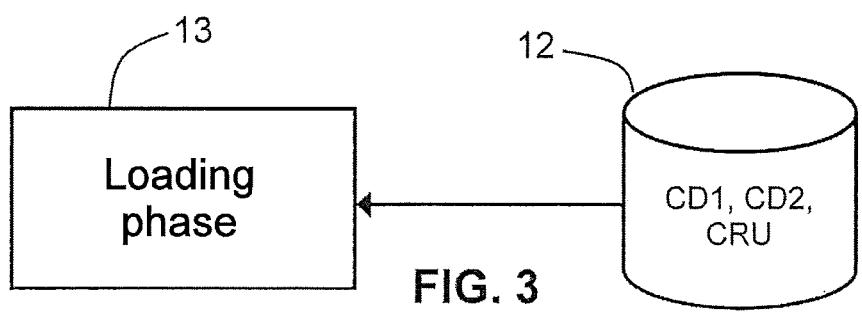
FIG. 3 shows a loading phase of a device and of a method according to one embodiment of the invention.
Figure 4:
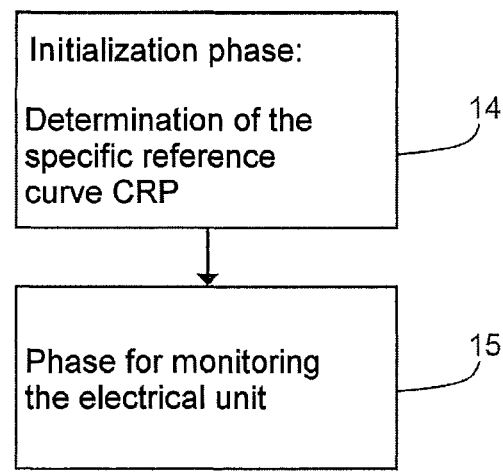
FIG. 4 shows an initialization and processing phase of a device and of a method according to one embodiment of the invention.

Thus, at the end of the learning phase, the learning data such as the curves of behaviour CD1, CD2 of the descriptors, and potentially the worn reference curve CRU, are firstly stored in memory, modelled and stored then loaded into each unit for the monitoring of its own wear. This learning data is common to all the monitoring devices associated with the same type of unit. FIG. 3 illustrates a phase 13 for loading learning data previously stored in units to be diagnosed.

In a first preferred embodiment, a diagnostic method according to the invention comprises:

a prior learning phase 11 for collecting, during a number of predetermined manoeuvres, learning data representative of at least two descriptor behaviour curves representative of predefined characteristics of said electrical signal over the life of said electrical unit, storing 12 said learning data CD1, CD2 in memory, the loading 13 of said learning data CD1, CD2, and the use of the learning data in said phase 15 for monitoring said electrical unit.

In a preferred embodiment, a diagnostic method according to the invention also comprises an initialization phase 14 for determining initialization data comprising a specific reference curve CRP for the product to be controlled, and the use of said initialization data in a monitoring phase 15 of said electrical unit.

During the monitoring phase, local descriptors DL1, DL2 with little sensitivity to the variations in temperature specific to each unit to be monitored are determined during the acquisition of measurement curves CM. These descriptors are of the same type as those that were used to generate global curves CD1, CD2 of behaviour of the descriptors with little sensitivity to the variations in temperature. In the preferred embodiment comprising at least two descriptors D1, D2 with little sensitivity to the variations in temperature, these descriptors will respectively yield global curves CD1, CD2 of behaviour previously generated, recorded and loaded, and respectively two local descriptors DL1, DL2 specific to each unit coming from measurement curves during the opening of the electrical unit.

Figure 5:
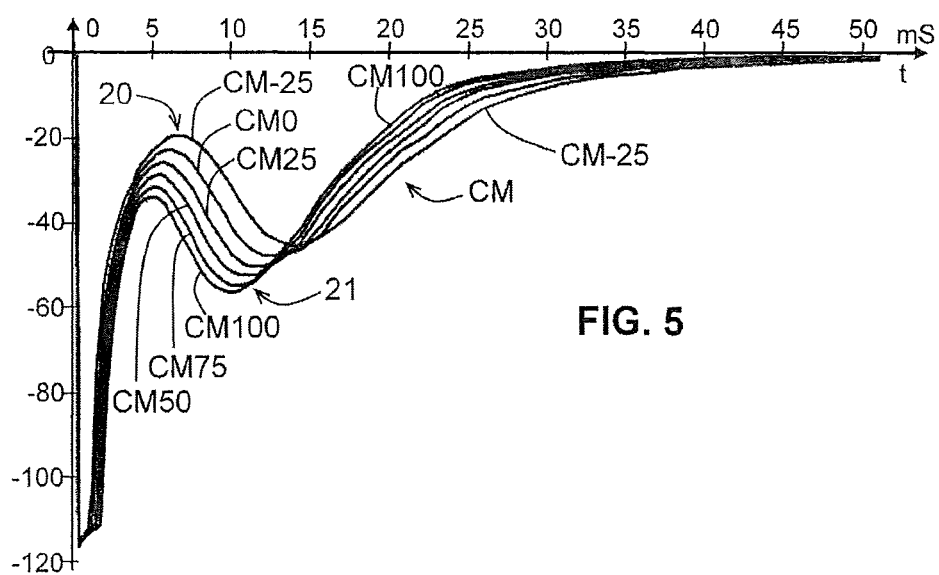
FIG. 5 shows measurement curves of a signal during the opening of an electrical unit to be monitored for various temperatures of operation.

FIG. 5 shows measurement curves CM, i.e. CM-25, CM0, CM25, CM50, CM75, CM100, representative of an electrical voltage signal on a control coil upon the opening of an electrical unit for various operating temperatures, respectively −25, 0, 25, 50, 75, and 100 degrees Celsius. Such a curve may just as well be a measurement curve CM during the monitoring phase of an electrical unit as a measurement curve during the learning phase for generating the curves of behaviour of the descriptors. On these curves, a first noteworthy point 20 corresponds to the first change in direction of the variation of voltage of the curve CM with a relative increase then decrease in value. The point 20 is also identified as the first reversal of the derivative of the signal. Subsequently, a second noteworthy point 21 corresponds to the second change in direction of the variation of voltage of the curve CM with a relative decrease then increase in value. At the second noteworthy point 21, there is a second reversal of the derivative of the signal of the measurement curves CM.

Figure 6:
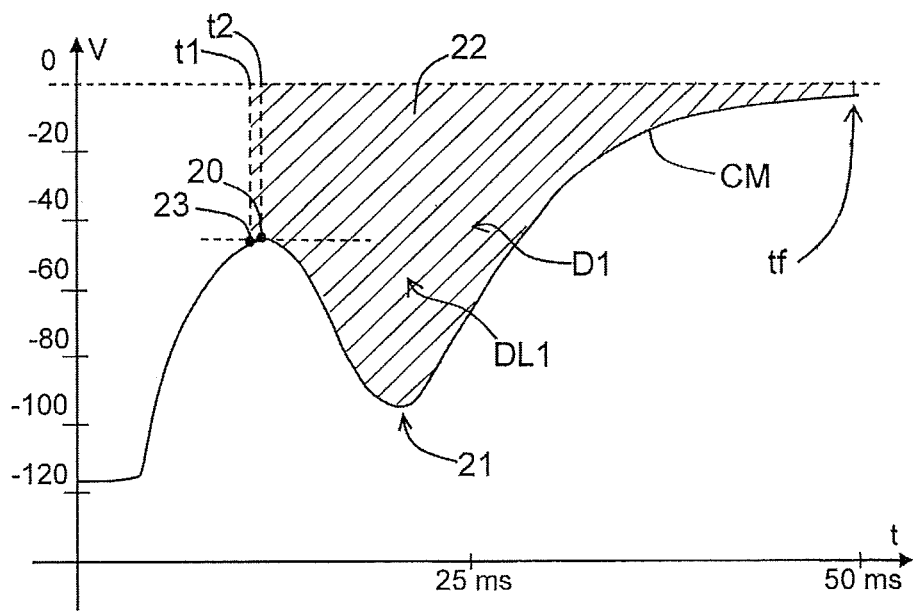
FIG. 6 shows a first descriptor for a device and a method according to one embodiment of the invention.

FIG. 6 shows a first descriptor D1 for a device and a method according to one embodiment of the invention. This first descriptor D1 corresponds to a surface 22 of the curve CM or to an integral or integration starting at a first point 23 of the measurement curve CM. Said first point 23 depends on the first noteworthy point 20 of the measurement curve CM corresponding to a first change in direction of the variation of the signal or change in sign of the derivative of said measurement signal. The first noteworthy point 20 is representative of the start of the movement of the mobile part of the electrical unit. The first descriptor D1 is also a representation of release, in other words of the magnetic flux at the time when the force of the spring from pressure of the contacts becomes greater than the magnetic force also corresponding to the start of the opening of the mobile part of the unit. Thus, this descriptor D1, determined by an integral whose start depends on the first noteworthy point 20, is very sensitive to the wear of the contact pads and very insensitive to the variations in temperature. The descriptor D1 is essentially based on the behaviours of the magnetic flux depending on the wear of the contacts. Preferably, the integral 22 of the signal starts at a time t1 in the range between 10 ms and 0 ms prior to the occurrence of the first noteworthy point 20 at a time t2 depending on the dynamic behaviour of the electrical unit. In FIG. 6, the integral of the signal terminates at the end $t_f$ of the capture of the signal of the curve CM. In a preferred mode of operation, the integral 22 ends when the coil voltage signal is substantially zero or close to zero volts, for example less than 2 Volts in absolute value. However, it may be limited to a fixed duration, for example the integration of the signal may last between 30 ms and 40 ms.

Figure 7:
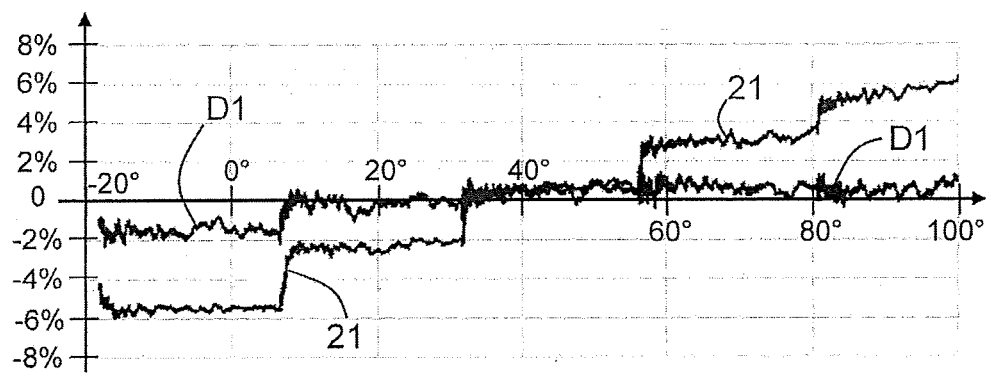
FIG. 7 shows curves of variations as a function of temperature of a first descriptor for a device and a method according to one embodiment of the invention and of a noteworthy point.

FIG. 7 shows curves of variations as a function of the temperature of a first descriptor D1 for a device and a method according to one embodiment of the invention and of a second noteworthy point 21 alone. This comparison shows that the descriptor D1 determined by an integral 22 has a precision of less than +−2% over a range of temperature of −20° C. to 100° C., whereas the point 21 alone may reach +−6%. Overall, between 0 and 100° C., the descriptor D1 is 10 times less sensitive to the variations in temperature than a descriptor based on the point 21 alone.

Figure 8:
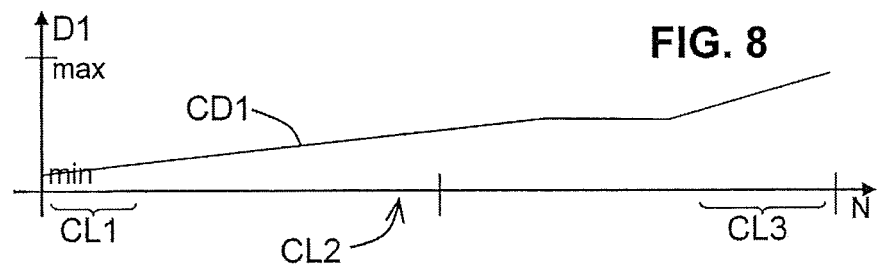
FIG. 8 shows a curve of behaviour of a first descriptor generated during a learning phase and used in a device and a method according to one embodiment of the invention.

FIG. 8 shows a curve of behaviour CD1 of a first descriptor D1 generated during a learning phase and used in a device and a method according to one embodiment of the invention.

Figure 9:
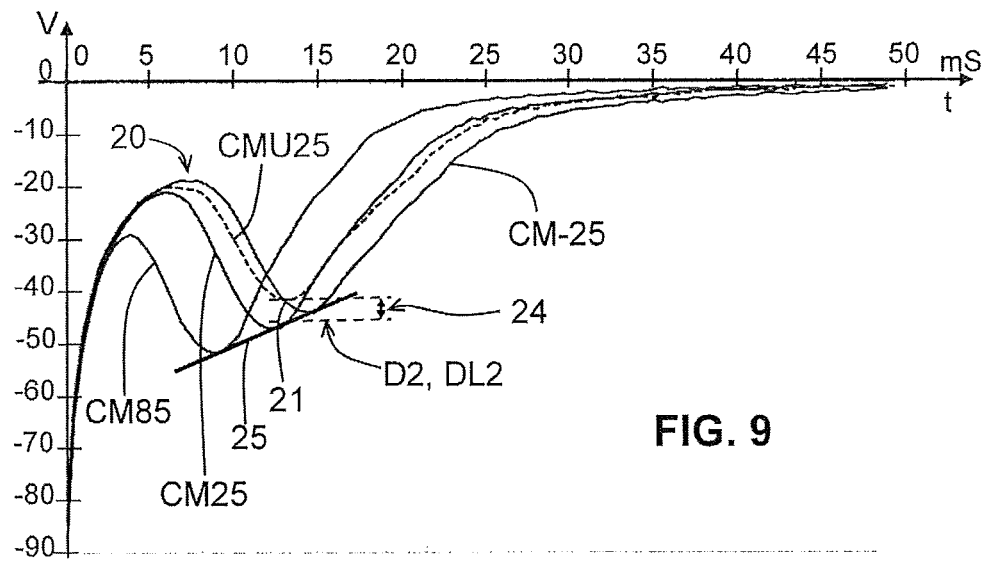
FIGS. 9 and 10 show a modelling of a second descriptor for a device and a method according to one embodiment of the invention.
Figure 10:
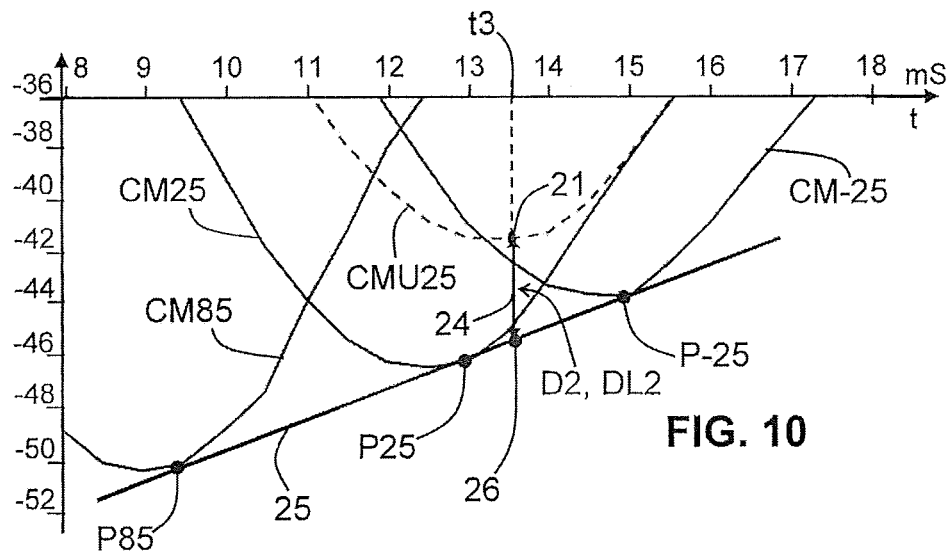

FIGS. 9 and 10 show a modelling of a second descriptor D2 for a device and a method according to one embodiment of the invention. The second descriptor D2 corresponds to a positioning or to a difference 24 of a second noteworthy point 21 of a signal measured on a curve CM with respect to an initial reference curve or line 25 defined with respect to second noteworthy points 21, P-25, P25, P85 of a new unit defined over a range of temperature, for example −25 to 85° C. Said second noteworthy point 21 corresponds to a variation in value such as the change in sign of the variation of a signal on the measurement curve CM, said signal decreasing then increasing in relative value around the second noteworthy point. In FIGS. 9 and 10, the second noteworthy points P-25, P25, P85 of a new unit are defined with three values of temperature respectively −25, 25 and 85° C. By using a reference line 25 dependant on a new unit over a range of temperature and by verifying the positioning of a noteworthy point 21 of a unit to be monitored on this reference curve, the descriptor D2 representative of this difference 24 becomes relatively insensitive to the temperature since the effects of variations in temperature are automatically compensated.

In FIG. 9 as a complete view of the acquisition of the measurement and in FIG. 10 as a detailed view, the curves CM-25, CM25 and CM85 correspond to curves during the learning for various temperatures, respectively −25, 25 and 85° C. Noteworthy points 21 of the new unit P-25, P25, P85 in the learning phase for various temperatures, respectively −25, 25 and 85° C., allow a reference line 25 to be defined. This line is preferably linear but it could take various, more complex, forms. The difference 24 yields the second descriptor D2 by comparing a value of the second noteworthy point 21 of a unit to be monitored which may be worn with the reference line 25. In FIG. 10, at a time t3, the second noteworthy point 21 of a worn unit is detected; this point is then compared with a value 26 of the reference curve 25 in the neighbourhood of the same time t3. At this time t3, the value of the difference 24 allows a value of the descriptor D2 to be determined.

Figure 11:
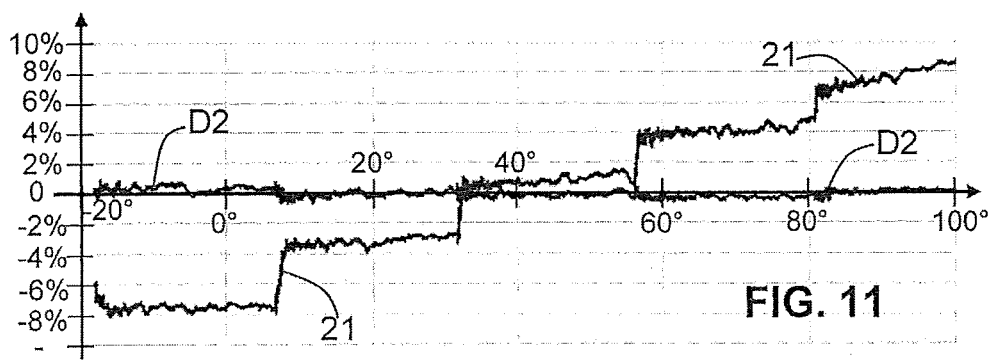
FIG. 11 shows curves of variations as a function of temperature of a second descriptor for a device and a method according to one embodiment of the invention and of a noteworthy point.

FIG. 11 shows curves of variations as a function of temperature of a second descriptor D2 for a device and a method according to one embodiment of the invention and of a noteworthy point 21 alone. This comparison shows that the descriptor D1, determined by a difference of a point 21 of a unit to be monitored with respect to a reference line of points 21 of new units pre-recorded at various temperatures, has a precision of less than +−1% over a range of temperature from −20° C. to 100° C., whereas the point 21 alone may reach +−8%. This mode of determination of the descriptor D2 provides an auto-compensation in temperature.

The descriptors D1 and D2 with little sensitivity to the temperature, to the differences in temperature or to the variations in temperature, are chosen or selected so as to have a difference in value of less than 5% between −20° C. and 80° C. Thus, according to one embodiment of the invention, at least one descriptor with little sensitivity to the temperature D1, DL1, D2, DL2 has a difference in value of less than 5% between −20° C. and 80° C.

Figure 12:
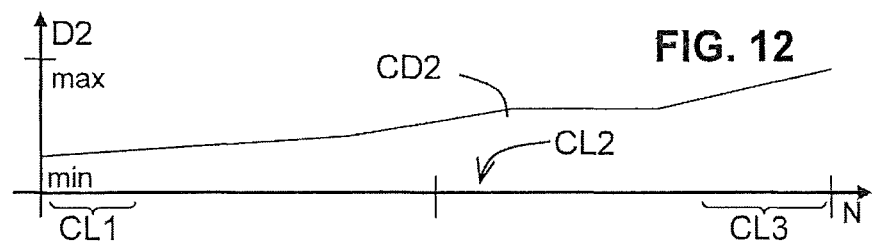
FIG. 12 shows a curve of behaviour of a second descriptor generated during a learning phase and used in a device and a method according to one embodiment of the invention.

FIG. 12 shows a curve of behaviour of a second descriptor D2 generated during a learning phase and used in a device and a method according to one embodiment of the invention.

Curves CD1 and CD2 are representative of the variation over time of the descriptors D1 and D2 come from learning curves established during the learning phase with a very large number of measurements. Subsequently, these numerous values have been modelled as straight line segments to yield the curves of behaviour of the descriptor CD1 and CD2 which will be loaded into the units to be monitored. These curves shown in FIGS. 8 and 12 comprise for example a few segments. The number of segments is not limited and is advantageously in the range between 1 and 20. However, other modelling modes are possible, for example using step-wise or polynomial approaches. Thus, the loaded learning data is representative of curves of behaviour CD1, CD2 of descriptors representative of predefined characteristics of said electrical signal over the life of the electrical units.

At the start of curves CD1, CD2 of behaviour of the descriptors, the descriptors are associated with global classes CL1 of units that are new or being run in, whereas at the end of the curves the descriptors are associated with classes CL3 of worn units. Between the classes CL1 and CL3, the descriptors are associated with classes CL2 of units in normal operation.

The use of at least two or more descriptors D1, D2 allows the detection with greater precision or certainty of the wear status of an electrical unit to be monitored. The descriptors described hereinabove depend on electrical quantities. However, other descriptors may also be used by combining electrical quantities and environmental quantities such as the temperature or the horizontal or vertical position of a unit. Such quantities may be used to select descriptors according to the environment. The curves of descriptors may also be selected according to the type of use of the electrical unit. Parameter settings allowing the type of product or electrical unit and the usage of said unit to be defined are also loaded with the corresponding learning data during the loading phase.

When the learning data is loaded into a device ready to run the diagnostic monitoring of the wear of an electrical unit such as a contactor, an initialization phase allows the storage in memory of the initial data specific to the unit to be monitored. Amongst these initial characteristics, there is advantageously the acquisition of a specific reference curve CRP. This reference curve is preferably stored in memory after a 'running in' of the unit corresponding to a predetermined number of first openings and/or when variations in the measurement curve CM become stable.

Figure 13:
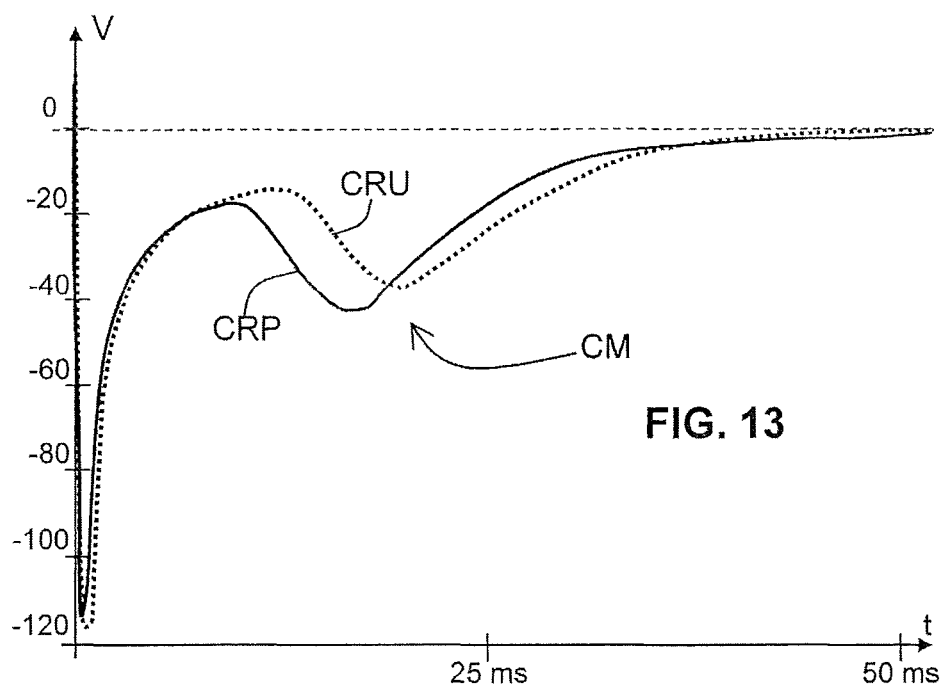
FIG. 13 shows a signal measurement curve for a unit in good or new condition and a signal measurement curve for a worn unit.

FIG. 13 shows two examples of curves: a first measurement curve CM for a new unit which may also be a specific reference curve CRP, and a measurement curve CM for a worn unit which may also be a reference curve for a worn unit CRU that may be pre-loaded. The other measurement curves CM over the life of the unit will fall between these two reference curves CRP and CRU.

FIG. 14 shows a flow diagram representing an initialization phase 14 for determining said initialization data comprising said specific reference curve CRP of the product to be monitored on which is installed, or with which is associated, the monitoring device. A step 30 shows the start of the initialization phase. A process 31 for determining a specific reference curve CRP comprises a processing step 32 where consecutive measurement curves are acquired, and a step 33 for monitoring the stability of the curve. The curve CM is considered as stable after a predetermined number of measurements Nstable, and/or when the measurement curve CM varies very little between two consecutive measurements CMn and CMn−1.

At a step 34, the measurement curve CM is recorded as a specific reference curve CRP, after a minimum number of manoeuvres when the differences between the curves after each opening become small. This curve is representative of the electrical characteristics of the voltage or of the current at the start of life of the product after 'running in'. It remains valid until the end of life of the product. In another embodiment, in order to further improve stability of the curve to be recorded, the specific reference curve CRP may also be an average of a few stable curves CM. A step 35 represents the monitoring phase of the product.

FIG. 15 shows that, after the loading phase 13 where learning data corresponding to a type of product representative of said electrical unit are previously loaded, and the initialization phase 14 where initialization data corresponding to said unit to be monitored are stored in memory, a monitoring phase 15 runs the monitoring when the electrical unit is opened.

In this particular embodiment, a step 36 detects the opening of the electrical unit. When the opening is detected, a step 37 performs the monitoring of the unit. This detection may be carried out by a signal external to the device or by the analysis of the measurement signal or of its variation. The monitoring phase is preferably run upon each opening of the electrical unit. However, it may also be run in a more spaced out manner, for example after a predetermined number of openings. The monitoring may also depend on the lifetime of the unit, for example the monitoring may be less frequent at the start of life after a running in phase and more frequent at the end of life for a greater precision.

FIG. 16 shows a flow diagram of a monitoring phase 15 with the detail of a monitoring step 37 according to one embodiment of the invention.

Said monitoring phase comprises:

at a step 40, the measurement and the acquisition of a measurement curve CM upon the opening of said electrical unit, at a step 41, the determination of values of local descriptors DL1, DL2 of said measurement curve CM as a function of values of said measurement curve CM, of recorded initialization data CRP, and of first loaded learning data, at least one of said local descriptors DL1, DL2 being a descriptor with little sensitivity to the differences in temperature and depending on noteworthy points 20 and/or 21 of said measurement curve CM, at a step 42, the determination of the positioning of the values of local descriptors DL1, DL2 with little sensitivity to the differences in temperature of the measurement curve CM with respect to second learning data CD1, CD2, and at steps 43-45, the determination of a global status class as a function of said positioning values of the values of descriptors DL1, DL2 of the measurement curve CM with respect to second learning data loaded.

Preferably, the determination of a global status class comprises:

at a step 43, the determination of points or of the closest differences between the values of local descriptors DL1, DL2 of the measurement curve CM and the corresponding descriptor behaviour curves CD1, CD2, at a step 44, determinations of intermediate status classes CL1 as a function of the closest positionings of the descriptors with respect to said descriptor behaviour curves, at a step 45, the selection of said global class as a function of results of said intermediate classes, and at a step 46, the signalling or the communication of the global wear class of the unit.

At the step 43, the determination of the closest differences may be carried out preferably in a global manner, for example with a point defined by the values of all the descriptors. However, it may also be carried out individually on each descriptor or in a mixed manner or semi-global manner with a part of the descriptors being grouped and another part individual.

At the step 46, the device 8 for signalling the status of the electrical unit may display the global wear class with a visual indicator or a separate channel for the class value. However, class values may be grouped, notably a class for a unit being run in and a class for normal operation may be signalled in a grouped manner or together on a single signal.

According to one embodiment of the invention, the device for diagnosing the wear status of an electrical switching unit is connected to an electromagnetic coil for actuating contacts of an electrical switching unit. It comprises a processing circuit for implementing the diagnostic method described hereinabove.

An electrical unit comprising high-power electrical contacts actuated by a control electromagnetic coil according to the invention comprises a device for diagnosing the wear status of an electrical switching unit connected to said electromagnetic coil for actuating said contacts for implementing the diagnostic method described hereinabove.

The device and the method may be implemented permanently or temporarily on the unit to be monitored. They may also be implemented on electrical units already installed. In addition, certain steps of the method may be carried out in local mode close to the unit, and other steps may be carried out remotely or in a centralized manner. For example, the acquisitions of the curves CM may be local and the rest of the processing may be carried out remotely for more elaborate calculations. In this case, the processing tasks are shared between a local module 7 and a remote module 9 as shown in FIG. 1.

Several types of loads or of categories of use are identified during the learning and monitoring phases. The processing of the types of loads is preferably carried out globally during the learning phase in such a manner as to take account of different situations. For example, several units will be used over a lifetime for different types of load. The curves of behaviour of the descriptors will be representative of curves with units having had different loads or conditions of use.

The categories of use for electrical units such as electrical contactors notably depend:

on the type of load: non-inductive, inductive, slip-ring motor, squirrel-cage motor;

on the type of control command: power-up, switch off, start-up, braking, inching motion;

on the type of applications: distribution, heating, compressor, ventilation, lifts, pumps, various machines; and/or on combinations of several criteria.

It is also possible to identify a type of load or a particular use and to characterize the method accordingly. For example for capacitive loads or others.

Classes of wear for each category of use are defined by descriptors. They allow the status of the product to be characterized and provide an indication of the lifetime of the product.

A non-limiting list of the main classes may be:

Class 1: product that is new or being run in,

Class 2: product in use,

Class 3: worn product,

Class 4: product at end of life.

In the preferred embodiments described hereinabove, the evaluation of the wear of the contacts is advantageously carried out based on the measurement of the voltage on the coil of the contactor. However, other signals may be used, notably a signal representative of a current flowing in the coil.

The invention claimed is:

1. A method for diagnosing the wear status of an electrical switching unit ming a device for diagnosing the wear status of the electrical switching unit connected to an electromaqietic coil for actuating contacts of the electrical switching unit ihiding a processing circuit having a local diagnostic processing module coupled directly to the electrical switching unit and connected to an external processing module remote from the electrical switching unit, the method comprising:

monitoring said electrical unit, wherein said monitoring uses: learning data previously loaded and corresponding to a type of product representative of said electrical unit, and initialization data corresponding to said unit to be monitored and stored in memory during an initialization phase, and wherein said monitoring further comprises:

acquiring a measurement curve upon the opening of said electrical unit, determining values of local descriptors from said measurement curve as a function of values of said measurement curve, of stored initialization data, and of first loaded learning data, at least one of said local descriptors being a descriptor with a type of sensitivity to the differences in temperature and dependent on points of said measurement curve, determining positioning of the values of local descriptors with the type of sensitivity to the temperature of the measurement curve with respect to second learning data, and determining a global status class as a function of said positioning values of the values of local descriptors and of the measurement curve with respect to said second learning data.

2. The diagnostic method according to claim 1, wherein a first descriptor corresponds to a curve surface or to an integral or integration starting at a first point of the curve, the measurement depending on a first noteworthy point of said curve, the measurement corresponding to a first change in direction of the variation of the signal or of change in sign of the derivative of said measurement signal, said first noteworthy point being representative of the start of the movement of a mobile part of the electrical unit.

3. The diagnostic method according to claim 2, wherein the integral of the signal starts at a time t1 in the range between 0 and 10 ms prior to the occurrence of said first noteworthy point.

4. The diagnostic method according to claim 2, wherein the integral of the signal ends when the signal of the coil voltage curve is zero volts.

5. The diagnostic method according to claim 2, wherein the integral of the signal lasts between 30 ms and 40 ms.

6. The diagnostic method according to claim 1, wherein a second descriptor corresponds to a positioning of to a difference of a second noteworthy point with respect to an aitia reference curve or line for said second noteworthy point of a new unit defined over a range of temperature, said second noteworthy point corresponding to a variation in value such that the change m sign of the variation of a signal on the measurement curve, said signal decreasing then increasing in relative value around the second noteworthy point.

7. The diagnostic method according to claim 1, wherein at least one descriptor with little sensitivity to the temperature has a difference in value of less than 5% between −20° C. and 80° C.

8. The diagnostic method according to claim 1, wherein loaded learning data are representative of curves of behaviour of descriptors representative of predefined Characteristics of said electrical signal during the lifetime of said electrical units.

9. The diagnostic method according to claim 1, wherein said descriptor behavior curves are loaded in a straight-line segment definition format order to reduce the memory space required by said learning data.

10. The diagnostic method according to claim 1, wherein values of said loaded descriptor behaviour curves are associated with status or wear classes of units to be monitored.

11. The diagnostic method according to claim 1, comprising:

a prior learning phase for collecting, during a number of predetermined manoeuvres, learning data representative of at least two curves of behaviour of descriptors representative of predefined characteristics of said electrical signal over the life of said electrical unit, storing in memory said learning data, the loading of said learning data, and the use of the learning data in said phase for monitoring said electrical unit.

12. A device for diagnosing the wear status of an electrical switching unit connected to an electromagnetic coil for actuating contacts of said electrical switching unit, the diagnostic device comprising:

a processing circuit for implementing a diagnosis of the wear status of an electrical switching unit implemented by monitoring said electrical unit, wherein said monitoring uses: learning data previously loaded and corresponding to a type of product representative of said electrical unit, and initialization data corresponding to said unit to be monitored and stored in memory during an initialization phase, and wherein said monitoring includes: acquiring measurement curve upon the opening of said electrical unit, the determination of values of local descriptors from said measurement curve as a function of values of said measurement curve, of stored initialization data, and of first loaded learning data, at least one of said local descriptors being a descriptor with low sensitivity to the differences in temperature and dependent on points of said measurement curve, determining the positioning of the values of local descriptors with low sensitivity to the temperature of the measurement curve with respect to second learning data and determining a global status class as a function of said positioning values of the values of local descriptors and of the measurement: curve with respect to said second learning data, wherein the processing circuit thither comprises a local diagnostic processing module coupled directly to said electrical switching unit and connected to an external processing module remote from said electrical switching unit.

13. An electrical unit comprising high-power electrical contacts actuated by a control electromagnetic coil and the device for diagnosing the wear status of the electrical switching unit connected to said electromagnetic coil for actuating said contacts and implementing the diagnostic method according to claim 1.

* * * * *